(12) United States Patent
Li et al.

(10) Patent No.: US 12,713,665 B2
(45) Date of Patent: Aug. 18, 2026

(54) SUPER-JUNCTION SEMICONDUCTOR DEVICE WITH ENLARGED PROCESS WINDOW FOR DESIRABLE BREAKDOWN VOLTAGE

(71) Applicant: SILICON-MAGIC SEMICONDUCTOR TECHNOLOGY (HANGZHOU) CO., LTD., Hangzhou (CN)

(72) Inventors: Lvqiang Li, Hangzhou City (CN); Hui Chen, Hangzhou City (CN); Jiakun Wang, Hangzhou City (CN)

(73) Assignee: SILICON-MAGIC SEMICONDUCTOR TECHNOLOGY (HANGZHOU) CO., LTD., Hangzhou (CN)

( * ) Notice: Subject to any disclaimer, the term of this patent is extended or adjusted under 35 U.S.C. 154(b) by 883 days.

(21) Appl. No.: 17/985,489

(22) Filed: Nov. 11, 2022

(65) Prior Publication Data

US 2023/0178591 A1 Jun. 8, 2023

(30) Foreign Application Priority Data

Dec. 8, 2021 (CN) ......................... 202111487782.2

(51) Int. Cl.

| | |
|---|---|
| ***H10D 62/10*** | (2025.01) |
| ***H10D 62/822*** | (2025.01) |
| ***H10D 62/83*** | (2025.01) |
| ***H10D 62/832*** | (2025.01) |

(52) U.S. Cl.
CPC ......... *H10D 62/111* (2025.01); *H10D 62/822* (2025.01); *H10D 62/8303* (2025.01); *H10D 62/8325* (2025.01)

(58) Field of Classification Search
None
See application file for complete search history.

(56) References Cited

U.S. PATENT DOCUMENTS

| | | | | |
|---|---|---|---|---|
| 2009/0032851 A1* | 2/2009 | Pfirsch | ................. | H10D 62/107 257/E21.135 |
| 2016/0087032 A1* | 3/2016 | Hiyoshi | ............... | H10D 62/111 257/77 |
| 2020/0091335 A1* | 3/2020 | Ono | ....................... | H10D 30/66 |
| 2020/0105529 A1* | 4/2020 | Ghandi | ................... | H10P 30/22 |

* cited by examiner

*Primary Examiner* — Nishath Yasmeen
(74) *Attorney, Agent, or Firm* — Osha Bergman Watanabe & Burton LLP

(57) ABSTRACT

A super-junction semiconductor device with an enlarged process window for a desirable breakdown voltage includes: a semiconductor substrate and an epitaxial layer deposited on the semiconductor substrate. The epitaxial layer includes a first semiconductor layer, and a second semiconductor layer disposed on the first semiconductor layer. A band gap of the first semiconductor layer is greater than a band gap of the second semiconductor layer. A super-junction structure is formed in the epitaxial layer, including at least one first epitaxial pillar of a first dopant type, and at least one second epitaxial pillar of a second dopant type. The first epitaxial pillar and the second epitaxial pillar are alternately arranged along a transverse direction. The epitaxial layer has a sandwich structure.

9 Claims, 2 Drawing Sheets

SUPER-JUNCTION SEMICONDUCTOR DEVICE WITH ENLARGED PROCESS WINDOW FOR DESIRABLE BREAKDOWN VOLTAGE

FIELD OF INVENTION

The present disclosure generally relates to the technical field of semiconductor power devices, in particular to a super-junction semiconductor device with an enlarged process window for a desirable breakdown voltage.

BACKGROUND

A super-junction structure is a structure utilizing the charge balancing technology, where PN junctions formed by alternately arranged P regions and N regions serve as a drift region, unlike traditional power devices where materials of the same conductivity type constitute a drift region. A transverse electric field is introduced into the drift region of the super-junction structure, so that the drift region can be completely depleted at a lower cut-off voltage, and the breakdown voltage of the device is dependent only on the thickness of the depletion layer and a corresponding critical electric field. Therefore, under the same withstand conditions, a doping concentration in the drift region of the super-junction structure can be one magnitude higher than that of the traditional power devices, which significantly reduces the on-resistance.

The super-junction structure has a high breakdown voltage, the key to which is charge balance between the P regions and the N regions. When the charges in the P regions are in balance with those in the N regions, the super-junction structure has a high breakdown voltage. When the charges in the P regions are out of balance with those in the N regions, the breakdown voltage is substantially lower. However, in practical applications, it is technically difficult to achieve the charge balance. In conventional arts, adjusting inclination angles of super-junction trenches or doping concentrations gradients are two common ways to increase the electric field intensity at a middle region of a super-junction structure and to decrease the electric field density at two ends of the super-junction structure, thus enlarging the process window of the semiconductor device for a desirable breakdown voltage. However, an excessively strong electric field at the middle region of the super-junction structure would cause breakdown of the semiconductor device, resulting in a low breakdown voltage.

SUMMARY

In view of the above description of the conventional arts, the present disclosure provides a super-junction semiconductor device with an enlarged process window for a desirable breakdown voltage to address the breakdown voltage reduction of conventional super-junction structures due to excessively strong electric fields at the middle regions.

The super-junction semiconductor device according to one or more embodiments comprises: a semiconductor substrate;

an epitaxial layer, deposited on the semiconductor substrate, wherein the epitaxial layer comprises a first semiconductor layer, and a second semiconductor layer disposed on the first semiconductor layer, wherein a band gap of the first semiconductor layer is greater than a band gap of the second semiconductor layer; and a super-junction structure formed in the epitaxial layer, wherein the super-junction structure comprises at least one first epitaxial pillar of a first dopant type, and at least one second epitaxial pillar of a second dopant type, wherein the first epitaxial pillar and the second epitaxial pillar are alternately arranged along a transverse direction, wherein the super-junction structure extends from an upper surface of the second semiconductor layer to a lower surface of the first semiconductor layer, wherein the first dopant type is opposite to the second dopant type.

In one or more embodiments, the semiconductor substrate is a silicon substrate, the first semiconductor layer comprises silicon carbide or diamond, and the second semiconductor layer comprises silicon.

In one or more embodiments, a thickness of the first semiconductor layer is greater than a thickness of the second semiconductor layer.

In one or more embodiments, the epitaxial layer further comprises a third semiconductor layer located on the lower surface of the first semiconductor layer. The super-junction structure extends downwardly from an upper surface of the second semiconductor layer to a lower surface of the third semiconductor layer, and the band gap of the first semiconductor layer is greater than a band gap of the third semiconductor layer.

In one or more embodiments, the semiconductor substrate is a silicon substrate, the first semiconductor layer comprises silicon carbide or diamond, the second semiconductor layer comprises silicon, and the third semiconductor layer comprises silicon.

In one or more embodiments, a thickness of the first semiconductor layer is greater than both a thickness of the second semiconductor layer, and a thickness of the third semiconductor layer.

In one or more embodiments, the first epitaxial pillar and the second epitaxial pillar are pairwise pillars with complementary slopes.

In one or more embodiments, the first dopant type is N type or P type, and the second dopant type is P type or N type.

In one or more embodiments, the super-junction semiconductor device is applicable in a super-junction diode, an insulated gate bipolar transistor (IGBT), or a vertical double-diffused metal oxide semiconductor (VDMOS).

As described above, the present disclosure provides a super-junction semiconductor device with an enlarged process window for a desirable breakdown voltage, whose super-junction structure comprises an epitaxial layer with a sandwich structure. Since the band gap of a lower layer of the sandwich structure is greater than that of an upper layer of the sandwich structure, when the electric field at a middle region of the super-junction structure is higher than the electric field at both ends of the super-junction structure, a critical electric field of the first semiconductor layer will be greater than that of the second semiconductor layer, preventing the middle region from being prematurely broken down. Thus, the process window for a desirable breakdown voltage of the device can be safely expanded without damaging the super-junction structure under high-withstand conditions.

DETAILED DESCRIPTION

The present disclosure is described below with reference to specific embodiments, and other advantages and effects of the present disclosure would be easily understood by one having ordinary skill in the art from the disclosure of the present specification. The disclosure may be performed or carried out in various ways and may be modified or altered in various aspects, without departing from the scope of the present disclosure.

Referring to FIGS. 1-5, it should be noted that the drawings provided in the present disclosure only illustrate the basic concept of the present disclosure in a schematic way, so the drawings only show the components related to the present disclosure. The drawings are not necessarily drawn according to the number, shape, and size of the components in actual implementation. The type, quantity, and proportion of each component can be changed as needed, and the components' layout may also be more complicated in actual implementation.

Figure 1:
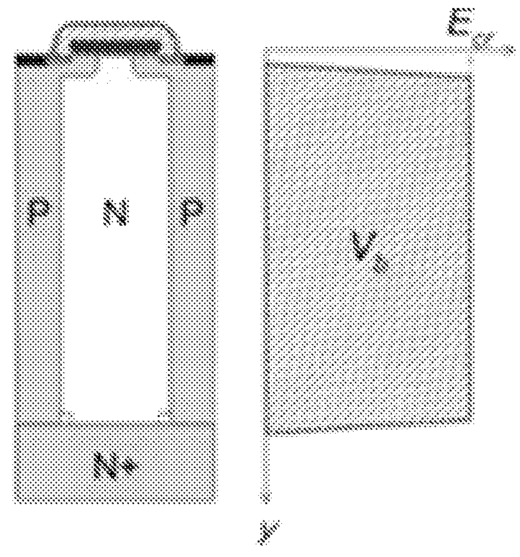
FIG. 1 shows a schematic diagram of a conventional super-junction structure without inclined super-junction trenches, and corresponding locations and electric field distributions.
Figure 2:
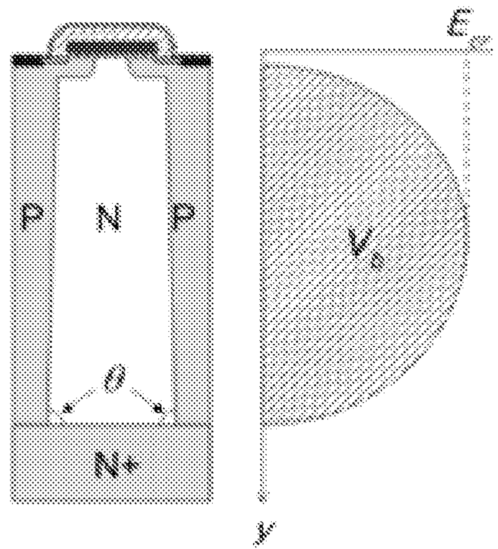
FIG. 2 shows a schematic diagram of a conventional super-junction structure with inclined super-junction trenches, and corresponding locations and electric field distributions.

As described in the Background section, a super-junction structure is a high-voltage-resistant semiconductor device utilizing the charge balancing technique, as shown in FIG. 1. When the charges in all of the P regions are in balance with the changes in all of the N regions of the super-junction structure, the super-junction structure has a high breakdown voltage Vb. In practical application, however, it is technically difficult to achieve perfect balance between the charges in the Pregions and those in the N regions. To prevent rapid reduction of the breakdown voltage caused by imbalanced charges, the trenches of the super-junction structure may be designed to be inclined. As shown in FIG. 2, the super-junction trenches are set to be inclined at an angle of θ, so that the electric field at the middle region of the super-junction structure is strengthened while the electric fields at the upper and lower ends of the super-junction structure are weakened. Such an arrangement can expand the process window for a desirable breakdown voltage. Alternatively, the super-junction structure can be designed to have a doping concentration gradient in the vertical direction. For example, the P regions have higher doping concentration in their top portions and lower concentration in their bottom portions, and conversely, the N regions have higher doping concentration in their bottom portions and lower doping concentration in their top portions. Such an approach also strengthens the electric field at the middle region of the super-junction structure, while the electric fields at the upper and lower ends of the super-junction structure are weakened. Although the process window for a desirable breakdown voltage can be enlarged by strengthening the electric field in the middle region, excessively high electric fields in the middle region would cause easier breakdown and poor withstand performance of the device.

A super-junction semiconductor device with an enlarged process window for a desirable breakdown voltage is provided. The present disclosure focuses on increasing high-voltage resistance at a middle region of a semiconductor device, and manages to expand the process window for a desirable breakdown voltage while maintaining a high breakdown voltage. Herein, the process window for a desirable breakdown voltage is to be understood in the following context: in a super-junction semiconductor device, a degree of charge non-equilibrium is defined as a ratio between the total charges in the P regions and the total charges in the N regions; when the two are equal, i.e., the degree of charge non-equilibrium is 1, charge balance is obtained, and the breakdown voltage of the semiconductor device is at a maximum value, $B_{vmax}$; when the degree of charge non-equilibrium deviates from 1, the breakdown voltage of the semiconductor device decreases. The process window for a desirable breakdown voltage corresponds to a range of the degree of charge non-equilibrium within which the actual breakdown voltage of the device can be maintained between $B_{vmax}$*A and $B_{vmax}$, wherein A is a predetermined percentage of the maximum value, and in some examples, any breakdown voltage between $B_{vmax}$*A and $B_{vmax}$ may be referred to as desirable.

Figure 3:
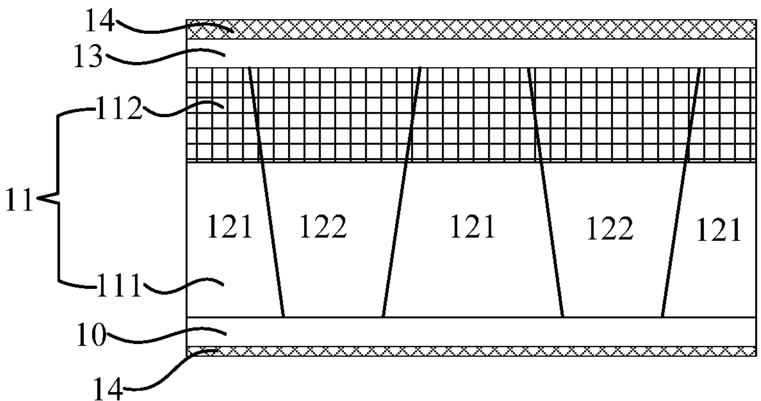
FIG. 3 shows a schematic diagram of a super-junction semiconductor device with an enlarged process window for a desirable breakdown voltage according to one or more embodiments of the present disclosure.
Figure 4:
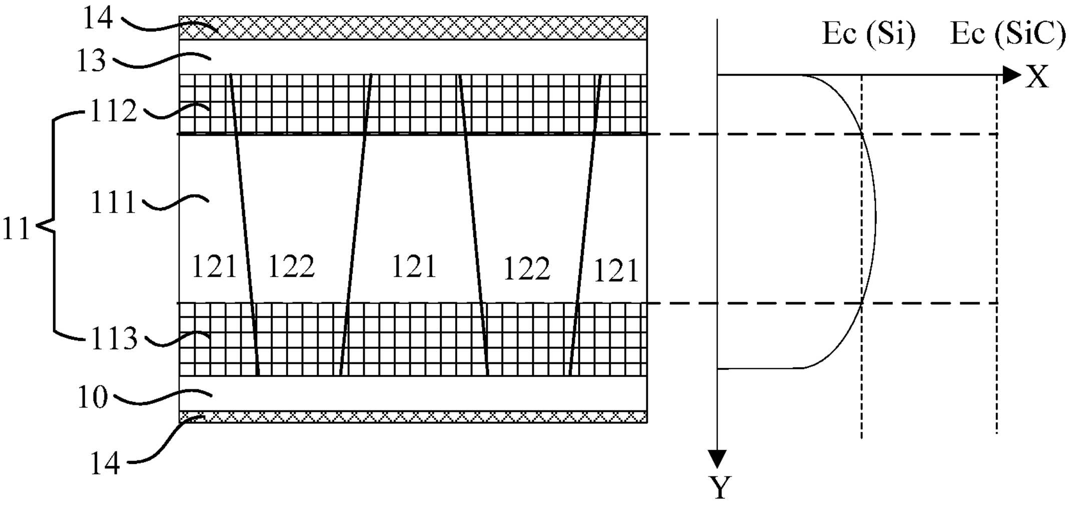
FIG. 4 shows a schematic diagram of a super-junction semiconductor device with an enlarged process window for a desirable breakdown voltage, and corresponding locations and electric field distributions, according to one or more embodiments of the present disclosure.

As shown in FIG. 3, the super-junction semiconductor device with an enlarged process window for a desirable breakdown voltage comprises a semiconductor substrate 10, and an epitaxial layer 11 deposited on the semiconductor substrate 10. The epitaxial layer 11 comprises a first semiconductor layer 111 and a second semiconductor layer 112 disposed on the first semiconductor layer 111. A band gap of the first semiconductor layer 111 is greater than a band gap of the second semiconductor layer 112. As such, a super-junction structure is formed in the epitaxial layer 11. The super-junction structure comprises at least one first epitaxial pillar 121 of a first dopant type, and at least one second epitaxial pillar 122 of a second dopant type. The first epitaxial pillar 121 and the second epitaxial pillar 122 are alternately arranged along a transverse direction (i.e., the X direction as shown in FIG. 4), and the super-junction structure extends from an upper surface of the second semiconductor layer 112 to a lower surface of the first semiconductor layer 111. The first dopant type is an electronically opposite type of the second dopant type.

The super-junction structure of the present disclosure comprises an epitaxial layer with a sandwich structure. Since the band gap of a lower layer of the sandwich structure is greater than that of an upper layer of the sandwich structure, when the electric field at a middle region of the super-junction structure is higher than the electric field at both ends of the super-junction structure, a critical electric field of the first semiconductor layer will be greater than that of the second semiconductor layer, preventing the middle region from being prematurely broken down. Thus, the process window for a desirable breakdown voltage of the device can be safely expanded.

As shown in a non-limiting example of FIG. 4, the epitaxial layer 11 further comprises a third semiconductor layer 113 arranged below the first semiconductor layer 111. The super-junction structure extends from the upper surface of the second semiconductor layer 112 downwardly to a lower surface of the third semiconductor layer 113. The band gap of the first semiconductor layer 111 is greater than that of the third semiconductor layer 113. That is, a semiconductor layer of a wider band gap is inserted between the two semiconductor layers with narrower band gaps, forming a sandwich structure in the Y direction as shown in FIG. 4. When the electric fields at two ends of the super-junction structure are lower than the electric field at the middle region of the super-junction structure, the middle region of the super-junction structure withstands a higher voltage. In this non-limiting example, the middle region is a semiconductor layer made of materials with a large band gap, and therefore, the critical electric field of the semiconductor material layer in the middle region can be effectively improved, preventing the middle region from being easily broken down. Thus, the process window for a desirable breakdown voltage of the device can be safely expanded.

Figure 5:
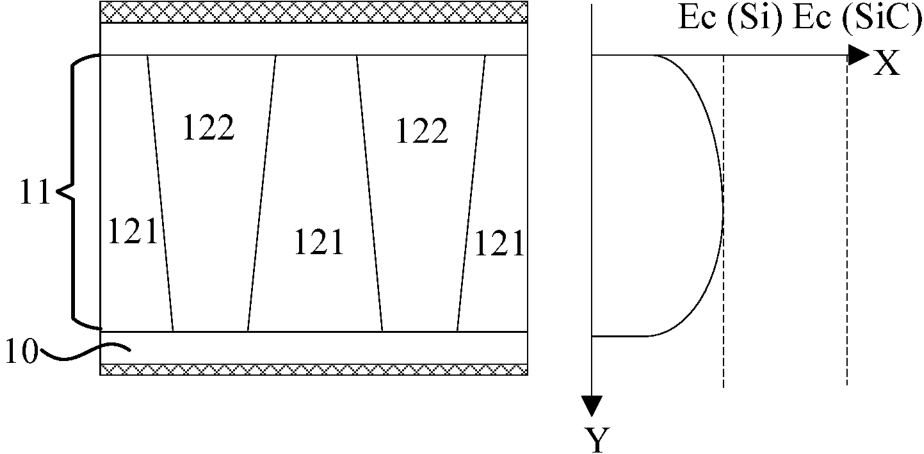
FIG. 5 shows a schematic diagram of a conventional super-junction structure with inclined super-junction trenches, and corresponding locations and electric field distributions, wherein the super-junction structure is located in an epitaxial layer made of silicon.

Turning to FIGS. 4 and 5. In FIG. 4, the epitaxial layer, from bottom to top, comprises a silicon layer (the third semiconductor layer 113), a silicon carbide layer (the first semiconductor layer 111), and a silicon layer (the second semiconductor layer 112). In FIG. 5, the epitaxial layer 11 is formed by a single silicon layer; that is, silicon is the only material used for fabricating the semiconductor material layer of the super-junction structure. The band gap of silicon is smaller than that of silicon carbide, and therefore, the critical electric field of silicon carbide is greater than that of silicon. As a result, in the super-junction structure of FIG. 5, the critical electric field of the middle region is determined by silicon's maximum bearable electric field, $E_c$(Si), and when the electric field of the middle region of the super-junction structure is greater than $E_c$(Si), there is a risk that the super-junction structure may be broken down. While in FIG. 4, the critical electric field of the middle region of the super-junction structure is determined by silicon carbide's maximum bearable electric field, $E_c$(SiC), and when the electric field of the middle region of the super-junction structure is greater than $E_c$(Si), the super-junction structure still maintains a certain degree of voltage resistance, preventing the super-junction structure from being easily broken down. Thus, the process window for a desirable breakdown voltage of the device can be safely expanded.

The super-junction semiconductor device of the embodiments may be a silicon substrate. When the epitaxial layer 11 has two layers, the first semiconductor layer 111 is made of silicon carbide or diamond, and the second semiconductor layer 112 is made of silicon (as shown in FIG. 3). When the epitaxial layer 11 has three layers, the first semiconductor layer 111 is made of silicon carbide or diamond, the second semiconductor layer 112 is made of silicon, and the third semiconductor layer 113 is made of silicon (as shown in FIG. 4). Taking lattice matching and thermal matching parameters between different materials into consideration, the first semiconductor layer 111 may be made of silicon carbide.

Referring to both FIGS. 3 and 4 as non-limiting examples, when the epitaxial layer 11 has two layers, the thickness of the first semiconductor layer 111 is greater than the thickness of the second semiconductor layer 112. When the epitaxial layer 11 has three layers, the thickness of the first semiconductor layer 111 is greater than the thickness of the second semiconductor layer 112 and the thickness of the third semiconductor layer 113.

As shown in FIGS. 3 and 4, the super-junction structure is formed in the epitaxial layer 11, wherein the first epitaxial pillar 121 and the second epitaxial pillar 122 may be complementary inclined pillars. That is, the first epitaxial pillar 121 and the second epitaxial pillar 122 are inclined in opposite directions. In one or more embodiments, the first epitaxial pillar 121 and the second epitaxial pillar 122 may also be un-inclined. A gradient doping process may be performed on the epitaxial pillars so as to create gradients of doping concentrations in the Y direction, so that the electric field at the middle region of the super-junction structure is greater than the electric fields at two ends of the super-junction structure.

As a non-limiting example, the epitaxial layer 11 may be formed by multiple epitaxial processes. The super-junction structure may be formed by ion implantations, or may be formed by trench etching and followed by epitaxial filling. Any existing process for preparing a super-junction structure may be applicable to the present disclosure.

The first dopant type is opposite to the second dopant type. For example, when the first dopant type is N type, the second dopant type is P type; conversely, when the first dopant type is P type, the second dopant type is N type.

The super-junction semiconductor device of the present disclosure is particularly applicable in super-junction diodes, insulated gate bipolar transistors (IGBT), and vertical double-diffused metal oxide semiconductor (VDMOS) device. As shown in non-limiting examples of FIGS. 3 and 4, the super-junction semiconductor device is applied in a super-junction diode device, wherein the semiconductor substrate 10 is an N-type region, above which is a P-type region 13. Surfaces of the N-type region and P-type region 13 facing away from the super-junction structure are respectively in contact with a metal lead-out layer 14. IGBT and VDMOS devices are commonly known semiconductor devices, and therefore, details of applying the super-junction semiconductor device in IGBT and VDMOS devices are readily understandable by person having ordinary skills in the art with references to the present disclosure.

In summary, the present disclosure provides a super-junction semiconductor device with an enlarged process window for a desirable breakdown voltage. The super-junction semiconductor device has a super-junction structure that comprises an epitaxial layer with a sandwich structure. Since the band gap of a lower layer of the sandwich structure is greater than that of an upper layer of the sandwich structure, when the electric field at a middle region of the super-junction structure is higher than the electric field at both ends of the super-junction structure, a critical electric field of the first semiconductor layer will be greater than that of the second semiconductor layer, preventing the middle region from being easily broken down. Thus, the process window for a desirable breakdown voltage of the device can be safely expanded. Embodiments of the present disclosure overcome various shortcomings in conventional art and has a high industrial value.

The above embodiments illustrate only the principles of the present disclosure and their efficacy, and are not intended to limit the present disclosure. Anyone familiar with this technique may modify or change the above embodiments without violating the spirit and scope of the present disclosure. Accordingly, all equivalent modifications or alterations made by persons with general knowledge in the technical field to which they belong, without departing from the spirit and technical ideas revealed in the present disclosure, shall still be covered by the claims of the present disclosure.

What is claimed is:

1. A super-junction semiconductor device with an enlarged process window comprising:

a semiconductor substrate;

an epitaxial layer disposed on the semiconductor substrate, wherein the epitaxial layer comprises a first semiconductor layer, a second semiconductor layer disposed on an upper surface of the first semiconductor layer, and a third semiconductor layer disposed on the lower surface of the first semiconductor layer, wherein a band gap of the first semiconductor layer is greater than a band gap of the second semiconductor layer and a band gap of the third semiconductor layer; and a super-junction structure formed in the epitaxial layer, wherein the super-junction structure comprises at least one first epitaxial pillar of a first dopant type and at least one second epitaxial pillar of a second dopant type, wherein the first epitaxial pillar and the second epitaxial pillar are alternately arranged along a transverse direction, wherein the super-junction structure extends downwardly from an upper surface of the second semiconductor layer to a lower surface of the third semiconductor layer, and wherein the first dopant type is opposite to the second dopant type.

2. The super-junction semiconductor device of claim 1, wherein the semiconductor substrate is a silicon substrate, the first semiconductor layer comprises silicon carbide or diamond, the second semiconductor layer comprises silicon, and the third semiconductor layer comprises silicon.

3. The super-junction semiconductor device of claim 2, wherein a thickness of the first semiconductor layer is greater than a thickness of the second semiconductor layer, and is greater than a thickness of the third semiconductor layer.

4. The super-junction semiconductor device of claim 1, wherein the first epitaxial pillar and the second epitaxial pillar are complementary inclined pillars.

5. The super-junction semiconductor device of claim 1, wherein the first dopant type is N type or P type, and the second dopant type is P type or N type.

6. A super-junction diode comprising the super-junction semiconductor device of claim 1.

7. An insulated gate bipolar transistor comprising the super-junction semiconductor device of claim 1.

8. A vertical double-diffused metal oxide semiconductor device comprising the super-junction semiconductor device of claim 1.

9. The super-junction semiconductor device of claim 1, wherein the first epitaxial pillar and the second epitaxial pillar are comprised in each of the first semiconductor layer and the second semiconductor layer.

* * * * *